(12) United States Patent
Kim et al.

(10) Patent No.: US 9,621,122 B2
(45) Date of Patent: Apr. 11, 2017

(54) MOBILE TERMINAL AND CONTROLLING METHOD THEREOF

(71) Applicant: LG ELECTRONICS INC., Seoul (KR)

(72) Inventors: Mina Kim, Seoul (KR); Byoungjoo Kwak, Seoul (KR); Hosung Song, Seoul (KR); Junggon Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 185 days.

(21) Appl. No.: 14/166,453

(22) Filed: Jan. 28, 2014

(65) Prior Publication Data

US 2014/0211969 A1 Jul. 31, 2014

(30) Foreign Application Priority Data

Jan. 29, 2013 (KR) .................. 10-2013-0009776

(51) Int. Cl.
*H03G 3/00* (2006.01)
*H03G 3/04* (2006.01)

(52) U.S. Cl.
CPC .................................... *H03G 3/04* (2013.01)

(58) Field of Classification Search
CPC ............ H04R 2430/01; H04R 2499/11; H04R 2499/15; H03G 5/025; H03G 5/02; H03G 3/001; H03G 3/002; H03G 3/00; H03G 3/02

USPC ......................................... 381/109, 104, 106
See application file for complete search history.

(56) References Cited

U.S. PATENT DOCUMENTS

| | | | | |
|---|---|---|---|---|
| 7,035,418 B1* | 4/2006 | Okuno | ..................... | H04N 7/15 348/14.05 |
| 2011/0013075 A1* | 1/2011 | Kim | ..................... | H04N 5/602 348/370 |
| 2012/0163625 A1* | 6/2012 | Siotis | ..................... | H04R 3/005 381/92 |
| 2014/0085538 A1* | 3/2014 | Kaine | ..................... | H04N 9/802 348/462 |
| 2014/0376728 A1* | 12/2014 | Ramo | ..................... | G06T 19/006 381/56 |

* cited by examiner

*Primary Examiner* — Md S Elahee
*Assistant Examiner* — Sabrina Diaz
(74) *Attorney, Agent, or Firm* — KED & Associates LLP

(57) ABSTRACT

A mobile terminal and controlling method thereof are disclosed, which facilitates a terminal to be used in further consideration of user's convenience. The present invention includes a display unit configured to display an image signal of a video, an audio output unit configured to output an audio signal of the video, and a controller configured to separate the audio signal of the video into sound sources, and control a volume of at least one of the sound sources manually or automatically.

29 Claims, 10 Drawing Sheets

(a)

(b)

(c)

(d)

(e)

(a)

(b)

MOBILE TERMINAL AND CONTROLLING METHOD THEREOF

CROSS-REFERENCE TO RELATED APPLICATION(S)

Pursuant to 35 U.S.C. §119(a), this application claims the benefit of earlier filing date and right of priority to Korean Application No. 10-2013-0009776, filed on Jan. 29, 2013, the contents of which are hereby incorporated by reference herein in their entirety.

BACKGROUND

1. Field

The present invention relates to a mobile terminal, and more particularly, to a mobile terminal and controlling method thereof. Although the present invention is suitable for a wide scope of applications, it is particularly suitable for separating an audio signal of a video played through the mobile terminal by sound sources and then adjusting volume of at least one of the separated sound sources.

2. Background

A mobile terminal is a device which may be configured to perform various functions. Examples of such functions include data and voice communications, capturing images and video via a camera, recording audio, playing music files and outputting music via a speaker system, and displaying images and video on a display.

Generally, terminals can be classified into mobile terminals and stationary terminals according to a presence or non-presence of mobility. And, the mobile terminals can be further classified into handheld terminals and vehicle mount terminals according to availability for hand-carry.

There are ongoing efforts to support and increase the functionality of mobile terminals. Such efforts include software and hardware improvements, as well as changes and improvements in the structural components which form the mobile terminal.

When a multimedia file such as a music file, a video file and the like is played through a mobile terminal, a user can listen to an audio signal of the multimedia file using a speaker, an earphone or the like. In doing so, the user can listen to the audio signal in appropriate volume by turning up or down a volume of the played multimedia file.

However, according to a related art, when a volume of an audio signal is adjusted, the volume adjustment is applied not to each sound source but to the whole audio signal. Hence, it may cause a problem that a user is unable to emphasize a specific one of a plurality of sound sources to listen to.

For instance, while a user is listening to an audio signal having voices of characters A to C mixed therein, if the user intends to turn up the volume of the voice of the character A among the 3 characters, since there is no method for implementing it, the user has to turn up the volumes of the character B and the character C as well.

SUMMARY OF THE INVENTION

Accordingly, embodiments of the present invention are directed to a mobile terminal and controlling method thereof that substantially obviate one or more problems due to limitations and disadvantages of the related art.

An object of the present invention is to provide a mobile terminal and controlling method thereof, by which user's convenience can be enhanced.

In particular, one object of the present invention is to provide a mobile terminal and controlling method thereof, by which a volume of at least one of separated sound sources generated from separating an audio signal of a video by sound sources can be adjusted.

Another object of the present invention is to provide a mobile terminal and controlling method thereof, by which a volume of a desired sound source can be automatically adjusted if the desired sound source is found from an audio signal of a video.

Additional advantages, objects, and features of the invention will be set forth in the disclosure herein as well as the accompanying drawings. Such aspects may also be appreciated by those skilled in the art based on the disclosure herein.

To achieve these objects and other advantages and in accordance with the purpose of the invention, as embodied and broadly described herein, a mobile terminal according to one embodiment of the present invention may include a display unit configured to display an image signal of a video, an audio output unit configured to output an audio signal of the video, and a controller configured to separate the audio signal of the video into sound sources, and control a volume of at least one of the sound sources manually or automatically.

In another aspect of the present invention, a method of controlling a mobile terminal according to another embodiment of the present invention may include the steps of playing a video, separating an audio signal of the video into sound sources, and controlling a volume of at least one of the sound sources manually or automatically.

Effects obtainable from the present invention may be non-limited by the above mentioned effect. And, other unmentioned effects can be clearly understood from the following description by those having ordinary skill in the technical field to which the present invention pertains.

It is to be understood that both the foregoing general description and the following detailed description of the present invention are exemplary and explanatory and are intended to provide further explanation of the invention as claimed.

BRIEF DESCRIPTION OF THE DRAWINGS

The embodiments will be described in detail with reference to the following drawings in which like reference numerals refer to like elements wherein.

DETAILED DESCRIPTION

In the following detailed description, reference is made to the accompanying drawing figures which form a part hereof, and which show by way of illustration specific embodiments of the invention. It is to be understood by those of ordinary skill in this technological field that other embodiments may be utilized, and structural, electrical, as well as procedural changes may be made without departing from the scope of the present invention. Wherever possible, the same reference numbers will be used throughout the drawings to refer to the same or similar parts.

As used herein, the suffixes 'module', 'unit' and 'part' are used for elements in order to facilitate the disclosure only. Therefore, significant meanings or roles are not given to the suffixes themselves and it is understood that the 'module', 'unit' and 'part' can be used together or interchangeably.

The present invention can be applicable to a various types of mobile terminals. Examples of such terminals include mobile phones, user equipments, smart phones, digital broadcast receivers, personal digital assistants, laptop computers, portable multimedia players (PMP), navigators and the like.

Yet, it is apparent to those skilled in the art that a configuration according to an embodiment disclosed in this specification is applicable to such a fixed terminal as a digital TV, a desktop computer and the like as well as a mobile terminal.

Figure 1:
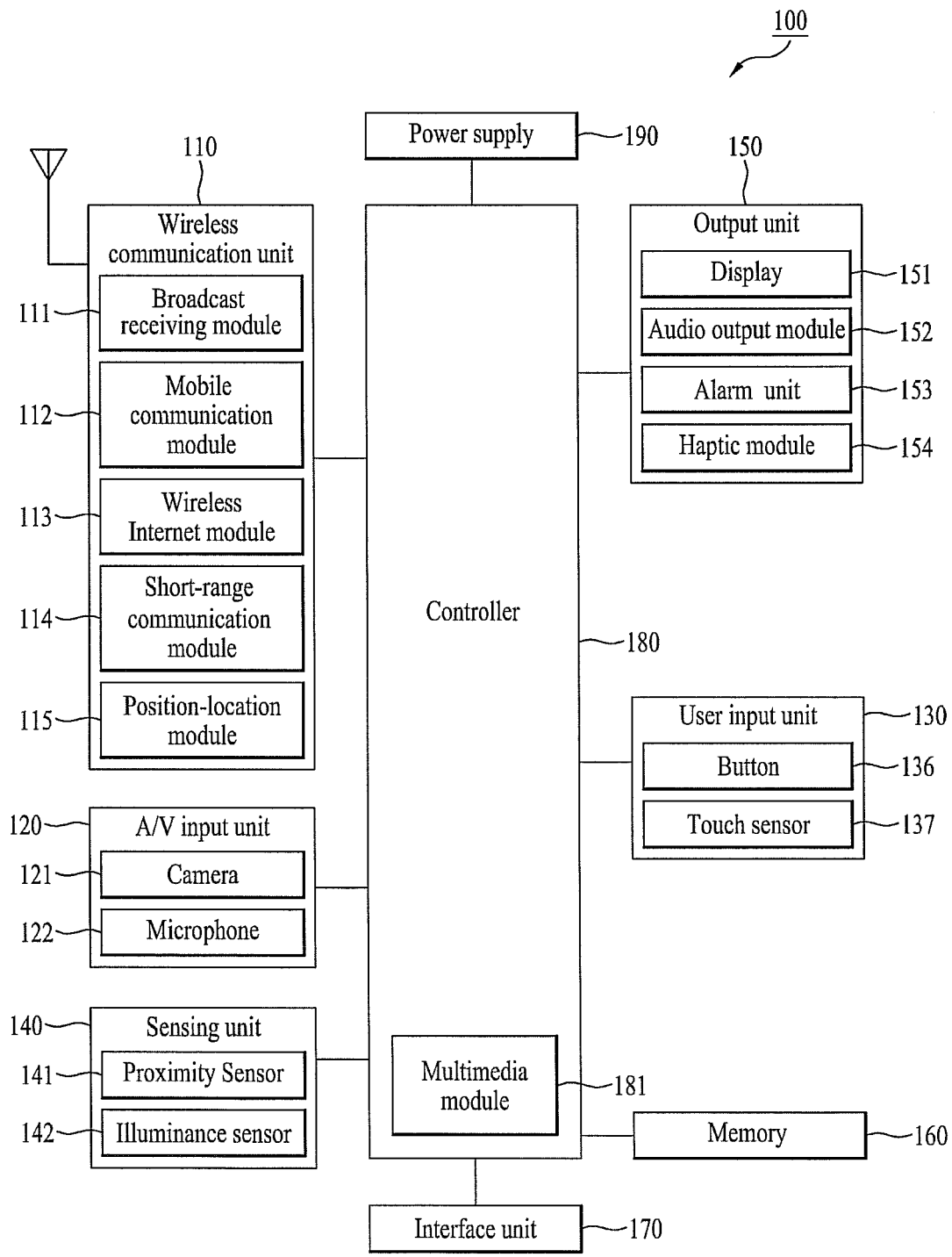
FIG. 1 is a block diagram of a mobile terminal according to one embodiment of the present invention.

FIG. 1 is a block diagram of a mobile terminal 100 in accordance with an embodiment of the present invention. FIG. 1 shows the mobile terminal 100 according to one embodiment of the present invention includes a wireless communication unit 110, an A/V (audio/video) input unit 120, a user input unit 130, a sensing unit 140, an output unit 150, a memory 160, an interface unit 170, a controller 180, a power supply unit 190 and the like. FIG. 1 shows the mobile terminal 100 having various components, but it is understood that implementing all of the illustrated components is not a requirement. Greater or fewer components may alternatively be implemented.

In the following description, the above elements of the mobile terminal 100 are explained in sequence.

First of all, the wireless communication unit 110 typically includes one or more components which permits wireless communication between the mobile terminal 100 and a wireless communication system or network within which the mobile terminal 100 is located. For instance, the wireless communication unit 110 can include a broadcast receiving module 111, a mobile communication module 112, a wireless internet module 113, a short-range communication module 114, a position-location module 115 and the like.

The broadcast receiving module 111 receives a broadcast signal and/or broadcast associated information from an external broadcast managing server via a broadcast channel. The broadcast channel may include a satellite channel and a terrestrial channel. At least two broadcast receiving modules 111 can be provided to the mobile terminal 100 in pursuit of simultaneous receptions of at least two broadcast channels or broadcast channel switching facilitation.

The broadcast managing server generally refers to a server which generates and transmits a broadcast signal and/or broadcast associated information or a server which is provided with a previously generated broadcast signal and/or broadcast associated information and then transmits the provided signal or information to a terminal. The broadcast signal may be implemented as a TV broadcast signal, a radio broadcast signal, and a data broadcast signal, among others. If desired, the broadcast signal may further include a broadcast signal combined with a TV or radio broadcast signal.

The broadcast associated information includes information associated with a broadcast channel, a broadcast program, a broadcast service provider, etc. And, the broadcast associated information can be provided via a mobile communication network. In this case, the broadcast associated information can be received by the mobile communication module 112.

The broadcast associated information can be implemented in various forms. For instance, broadcast associated information may include an electronic program guide (EPG) of digital multimedia broadcasting (DMB) and electronic service guide (ESG) of digital video broadcast-handheld (DVB-H).

The broadcast receiving module 111 may be configured to receive broadcast signals transmitted from various types of broadcast systems. By nonlimiting example, such broadcasting systems include digital multimedia broadcasting-terrestrial (DMB-T), digital multimedia broadcasting-satellite (DMB-S), digital video broadcast-handheld (DVB-H), Convergence of Broadcasting and Mobile Service (DVB-CBMS), Open Mobile Alliance-BroadCAST (OMA-BCAST), China Multimedia Mobile Broadcasting (CMMB), Mobile Broadcasting Business Management System (MBBMS), the data broadcasting system known as media forward link only (MediaFLO®) and integrated services digital broadcast-terrestrial (ISDB-T). Optionally, the broadcast receiving module 111 can be configured suitable for other broadcasting systems as well as the above-explained digital broadcasting systems.

The broadcast signal and/or broadcast associated information received by the broadcast receiving module 111 may be stored in a suitable device, such as a memory 160.

The mobile communication module 112 transmits/receives wireless signals to/from one or more network entities (e.g., base station, external terminal, server, etc.) via a mobile network such as GSM (Global System for Mobile communications), CDMA (Code Division Multiple Access), WCDMA (Wideband CDMA) and so on. Such wireless signals may represent audio, video, and data according to text/multimedia message transceivings, among others.

The wireless internet module 113 supports Internet access for the mobile terminal 100. This module may be internally or externally coupled to the mobile terminal 100. In this case, the wireless Internet technology can include WLAN (Wireless LAN) (Wi-Fi), Wibro (Wireless broadband), Wimax (World Interoperability for Microwave Access), HSDPA (High Speed Downlink Packet Access), GSM, CDMA, WCDMA, LTE (Long Term Evolution) etc.

Wireless internet access by Wibro, HSPDA, GSM, CDMA, WCDMA, LTE or the like is achieved via a mobile communication network. In this aspect, the wireless internet module 113 configured to perform the wireless internet access via the mobile communication network can be understood as a sort of the mobile communication module 112.

The short-range communication module 114 facilitates relatively short-range communications. Suitable technologies for implementing this module include radio frequency identification (RFID), infrared data association (IrDA), ultra-wideband (UWB), as well at the networking technologies commonly referred to as Bluetooth and ZigBee, to name a few.

The position-location module 115 identifies or otherwise obtains the location of the mobile terminal 100. If desired, this module may be implemented with a global positioning system (GPS) module. According to the current technology, the GPS module 115 is able to precisely calculate current 3-dimensional position information based on at least one of longitude, latitude and altitude and direction (or orientation) by calculating distance information and precise time information from at least three satellites and then applying triangulation to the calculated information. Currently, location and time informations are calculated using three satellites, and errors of the calculated location position and time informations are then amended using another satellite. Besides, the GPS module 115 is able to calculate speed information by continuously calculating a real-time current location.

Referring to FIG. 1, the audio/video (NV) input unit 120 is configured to provide audio or video signal input to the mobile terminal 100. As shown, the A/V input unit 120 includes a camera 121 and a microphone 122. The camera 121 receives and processes image frames of still pictures or video, which are obtained by an image sensor in a video call mode or a photographing mode. And, the processed image frames can be displayed on the display 151.

The image frames processed by the camera 121 can be stored in the memory 160 or can be externally transmitted via the wireless communication unit 110. Optionally, at least two cameras 121 can be provided to the mobile terminal 100 according to environment of usage.

The microphone 122 receives an external audio signal while the portable device is in a particular mode, such as phone call mode, recording mode and voice recognition. This audio signal is processed and converted into electric audio data. The processed audio data is transformed into a format transmittable to a mobile communication base station via the mobile communication module 112 in case of a call mode. The microphone 122 typically includes assorted noise removing algorithms to remove noise generated in the course of receiving the external audio signal.

The user input unit 130 generates input data responsive to user manipulation of an associated input device or devices. Examples of such devices include a button 136 provided to front/rear/lateral side of the mobile terminal 100 and a touch sensor (constant pressure/electrostatic) 137 and may further include a key pad, a dome switch, a jog wheel, a jog switch and the like [not shown in the drawing].

The sensing unit 140 provides sensing signals for controlling operations of the mobile terminal 100 using status measurements of various aspects of the mobile terminal. For instance, the sensing unit 140 may detect an open/close status of the mobile terminal 100, relative positioning of components (e.g., a display and keypad) of the mobile terminal 100, a change of position of the mobile terminal 100 or a component of the mobile terminal 100, a presence or absence of user contact with the mobile terminal 100, orientation or acceleration/deceleration of the mobile terminal 100. By nonlimiting example, such sensing unit 140 include, gyro sensor, accelerate sensor, geomagnetic sensor.

As an example, consider the mobile terminal 100 being configured as a slide-type mobile terminal. In this configuration, the sensing unit 140 may sense whether a sliding portion of the mobile terminal is open or closed. Other examples include the sensing unit 140 sensing the presence or absence of power provided by the power supply 190, the presence or absence of a coupling or other connection between the interface unit 170 and an external device. And, the sensing unit 140 can include a proximity sensor 141.

The output unit 150 generates outputs relevant to the senses of sight, hearing, touch and the like. And, the output unit 150 includes the display 151, an audio output module 152, an alarm unit 153, and a haptic module 154 and the like.

The display 151 is typically implemented to visually display (output) information associated with the mobile terminal 100. For instance, if the mobile terminal is operating in a phone call mode, the display will generally provide a user interface (UI) or graphical user interface (GUI) which includes information associated with placing, conducting, and terminating a phone call. As another example, if the mobile terminal 100 is in a video call mode or a photographing mode, the display 151 may additionally or alternatively display images which are associated with these modes, the UI or the GUI.

The display module 151 may be implemented using known display technologies including, for example, a liquid crystal display (LCD), a thin film transistor-liquid crystal display (TFT-LCD), an organic light-emitting diode display (OLED), a flexible display and a three-dimensional display. The mobile terminal 100 may include one or more of such displays.

Some of the above displays can be implemented in a transparent or optical transmittive type, which can be named a transparent display. As a representative example for the transparent display, there is TOLED (transparent OLED) or the like. A rear configuration of the display 151 can be implemented in the optical transmittive type as well. In this configuration, a user is able to see an object in rear of a terminal body via the area occupied by the display 151 of the terminal body.

At least two displays 151 can be provided to the mobile terminal 100 in accordance with the implemented configuration of the mobile terminal 100. For instance, a plurality of displays can be arranged on a single face of the mobile terminal 100 in a manner of being spaced apart from each other or being built in one body. Alternatively, a plurality of displays can be arranged on different faces of the mobile terminal 100.

In case that the display 151 and the touch sensor 137 configures a mutual layer structure (hereinafter called 'touch screen'), it is able to use the display 151 as an input device as well as an output device. In this case, the touch sensor can be configured as a touch film, a touch sheet, a touchpad or the like.

The touch sensor 137 can be configured to convert a pressure applied to a specific portion of the display 151 or a variation of a capacitance generated from a specific portion of the display 151 to an electric input signal. Moreover, it is able to configure the touch sensor 137 to detect a pressure of a touch as well as a touched position or size.

If a touch input is made to the touch sensor 137, signal(s) corresponding to the touch is transferred to a touch controller. The touch controller processes the signal(s) and then transfers the processed signal(s) to the controller 180. Therefore, the controller 180 is able to know whether a prescribed portion of the display 151 is touched.

Figure 2:
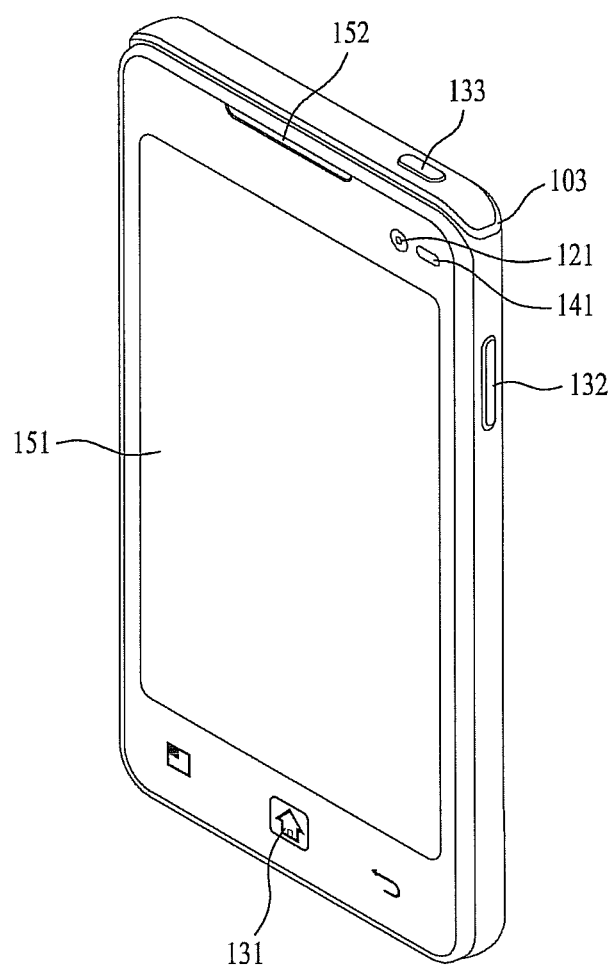
FIG. 2 is a front perspective diagram of a mobile terminal according to one embodiment of the present invention.

Referring to FIG. 2, a proximity sensor (141) can be provided to an internal area of the mobile terminal 100 enclosed by the touchscreen or around the touchscreen. The proximity sensor is the sensor that detects a presence or non-presence of an object approaching a prescribed detecting surface or an object existing around the proximity sensor using an electromagnetic field strength or infrared ray without mechanical contact. Hence, the proximity sensor has durability longer than that of a contact type sensor and also has utility wider than that of the contact type sensor.

The proximity sensor can include one of a transmittive photoelectric sensor, a direct reflective photoelectric sensor, a mirror reflective photoelectric sensor, a radio frequency oscillation proximity sensor, an electrostatic capacity proximity sensor, a magnetic proximity sensor, an infrared proximity sensor and the like. In case that the touchscreen includes the electrostatic capacity proximity sensor, it is configured to detect the proximity of a pointer using a variation of electric field according to the proximity of the pointer. In this case, the touchscreen (touch sensor) can be classified as the proximity sensor.

For clarity and convenience of the following description, as a pointer becomes proximate to a touchscreen without coming into contact with the touchscreen, if the pointer is perceived as situated over the touchscreen, such an action shall be named 'proximity touch'. If a pointer actually comes into contact with a touchscreen, such an action shall be named 'contact touch'. A proximity-touched position over the touchscreen with the pointer may mean a position at which the pointer vertically opposes the touchscreen when the touchscreen is proximity-touched with the pointer.

The proximity sensor detects a proximity touch and a proximity touch pattern (e.g., a proximity touch distance, a proximity touch duration, a proximity touch position, a proximity touch shift state, etc.). And, information corresponding to the detected proximity touch action and the detected proximity touch pattern can be outputted to the touchscreen.

The audio output module 152 functions in various modes including a call-receiving mode, a call-placing mode, a recording mode, a voice recognition mode, a broadcast reception mode and the like to output audio data which is received from the wireless communication unit 110 or is stored in the memory 160. During operation, the audio output module 152 outputs audio relating to a particular function (e.g., call received, message received, etc.). The audio output module 152 is often implemented using one or more speakers, buzzers, other audio producing devices, and combinations thereof.

The alarm unit 153 is output a signal for announcing the occurrence of a particular event associated with the mobile terminal 100. Typical events include a call received event, a message received event and a touch input received event. The alarm unit 153 is able to output a signal for announcing the event occurrence by way of vibration as well as video or audio signal. The video or audio signal can be outputted via the display 151 or the audio output unit 152. Hence, the display 151 or the audio output module 152 can be regarded as a part of the alarm unit 153.

The haptic module 154 generates various tactile effects that can be sensed by a user. Vibration is a representative one of the tactile effects generated by the haptic module 154. Strength and pattern of the vibration generated by the haptic module 154 are controllable. For instance, different vibrations can be outputted in a manner of being synthesized together or can be outputted in sequence.

The haptic module 154 is able to generate various tactile effects as well as the vibration. For instance, the haptic module 154 generates the effect attributed to the arrangement of pins vertically moving against a contact skin surface, the effect attributed to the injection/suction power of air though an injection/suction hole, the effect attributed to the skim over a skin surface, the effect attributed to the contact with electrode, the effect attributed to the electrostatic force, the effect attributed to the representation of hold/cold sense using an endothermic or exothermic device and the like.

The haptic module 154 can be implemented to enable a user to sense the tactile effect through a muscle sense of finger, arm or the like as well as to transfer the tactile effect through a direct contact. Optionally, at least two haptic modules 154 can be provided to the mobile terminal 100 in accordance with the corresponding configuration type of the mobile terminal 100.

The memory unit 160 is generally used to store various types of data to support the processing, control, and storage requirements of the mobile terminal 100. Examples of such data include program instructions for applications operating on the mobile terminal 100, contact data, phonebook data, messages, audio, still pictures (or photo), moving pictures, etc. And, a recent use history or a cumulative use frequency of each data (e.g., use frequency for each phonebook, each message or each multimedia) can be stored in the memory unit 160. Moreover, data for various patterns of vibration and/or sound outputted in case of a touch input to the touchscreen can be stored in the memory unit 160.

The memory 160 may be implemented using any type or combination of suitable volatile and non-volatile memory or storage devices including hard disk, random access memory (RAM), static random access memory (SRAM), electrically erasable programmable read-only memory (EEPROM), erasable programmable read-only memory (EPROM), programmable read-only memory (PROM), read-only memory (ROM), magnetic memory, flash memory, magnetic or optical disk, multimedia card micro type memory, card-type memory (e.g., SD memory, XD memory, etc.), or other similar memory or data storage device. And, the mobile terminal 100 is able to operate in association with a web storage for performing a storage function of the memory 160 on Internet.

The interface unit 170 is often implemented to couple the mobile terminal 100 with external devices. The interface unit 170 receives data from the external devices or is supplied with the power and then transfers the data or power to the respective elements of the mobile terminal 100 or enables data within the mobile terminal 100 to be transferred to the external devices. The interface unit 170 may be configured using a wired/wireless headset port, an external charger port, a wired/wireless data port, a memory card port, a port for coupling to a device having an identity module, audio input/output ports, video input/output ports, an earphone port and/or the like.

The identity module is the chip for storing various kinds of information for authenticating a use authority of the mobile terminal 100 and can include User Identify Module (UIM), Subscriber Identify Module (SIM), Universal Subscriber Identity Module (USIM) and/or the like. A device having the identity module (hereinafter called 'identity device') can be manufactured as a smart card. Therefore, the identity device is connectible to the mobile terminal 100 via the corresponding port.

When the mobile terminal 110 is connected to an external cradle, the interface unit 170 becomes a passage for supplying the mobile terminal 100 with a power from the cradle or a passage for delivering various command signals inputted from the cradle by a user to the mobile terminal 100. Each of the various command signals inputted from the cradle or the power can operate as a signal enabling the mobile terminal 100 to recognize that it is correctly loaded in the cradle.

The controller 180 typically controls the overall operations of the mobile terminal 100. For example, the controller 180 performs the control and processing associated with voice calls, data communications, video calls, etc. The controller 180 may include a multimedia module 181 that provides multimedia playback. The multimedia module 181 may be configured as part of the controller 180, or implemented as a separate component.

Moreover, the controller 180 is able to perform a pattern (or image) recognizing process for recognizing a writing input and a picture drawing input carried out on the touchscreen as characters or images, respectively.

The power supply unit 190 provides power required by the various components for the mobile terminal 100. The power may be internal power, external power, or combinations thereof.

A battery may include a built-in rechargeable battery and may be detachably attached to the terminal body for a charging and the like. A connecting port may be configured as one example of the interface 170 via which an external charger for supplying a power of a battery charging is electrically connected.

Various embodiments described herein may be implemented in a computer-readable medium using, for example, computer software, hardware, or some combination thereof.

For a hardware implementation, the embodiments described herein may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described herein, or a selective combination thereof. Such embodiments may also be implemented by the controller 180.

For a software implementation, the embodiments described herein may be implemented with separate software modules, such as procedures and functions, each of which perform one or more of the functions and operations described herein. The software codes can be implemented with a software application written in any suitable programming language and may be stored in memory such as the memory 160, and executed by a controller or processor, such as the controller 180.

FIG. 2 is a front perspective diagram of a mobile terminal according to one embodiment of the present invention.

The mobile terminal 100 shown in the drawing has a bar type terminal body. Yet, the mobile terminal 100 may be implemented in a variety of different configurations. Examples of such configurations include folder-type, slide-type, rotational-type, swing-type and combinations thereof.

For clarity, further disclosure will primarily relate to a bar-type mobile terminal 100. However such teachings apply equally to other types of mobile terminals.

Referring to FIG. 2A, the mobile terminal 100 includes a case (101, 102, 103) configuring an exterior thereof. In the present embodiment, the case can be divided into a front case 101 and a rear case 102. Various electric/electronic parts are loaded in a space provided between the front and rear cases 101 and 102.

Occasionally, electronic components can be mounted on a surface of the rear case 102. The electronic part mounted on the surface of the rear case 102 may include such a detachable part as a battery, a USIM card, a memory card and the like. In doing so, the rear case 102 may further include a backside cover 103 configured to cover the surface of the rear case 102. In particular, the backside cover 103 has a detachable configuration for user's convenience. If the backside cover 103 is detached from the rear case 102, the surface of the rear case 102 is exposed.

Referring to FIG. 2, if the backside cover 103 is attached to the rear case 102, a lateral side of the rear case 102 may be exposed in part. If a size of the backside cover 103 is decreased, a rear side of the rear case 102 may be exposed in part. If the backside cover 103 covers the whole rear side of the rear case 102, it may include an opening 103' configured to expose a camera 121' or an audio output unit 152' externally.

The cases 101, 102 and 103 are formed by injection molding of synthetic resin or can be formed of metal substance such as stainless steel (STS), titanium (Ti) or the like for example.

A display 151, an audio output unit 152, a camera 121, user input units 130/131 and 132, a microphone 122, an interface 180 and the like can be provided to the case 101 or 102.

The display 151 occupies most of a main face of the front case 101. The audio output unit 152 and the camera 121 are provided to an area adjacent to one of both end portions of the display 151, while the user input unit 131 and the microphone 122 are provided to another area adjacent to the other end portion of the display 151. The user input unit 132 and the interface 170 can be provided to lateral sides of the front and rear cases 101 and 102.

The input unit 130 is manipulated to receive a command for controlling an operation of the terminal 100. And, the input unit 130 is able to include a plurality of manipulating units 131 and 132. The manipulating units 131 and 132 can be named a manipulating portion and may adopt any mechanism of a tactile manner that enables a user to perform a manipulation action by experiencing a tactile feeling.

Content inputted by the first or second manipulating unit 131 or 132 can be diversely set. For instance, such a command as start, end, scroll and the like is inputted to the first manipulating unit 131. And, a command for a volume adjustment of sound outputted from the audio output unit 152 and the like can be inputted to the second manipulating unit 132, a command for a switching to a touch recognizing mode of the display 151 and the like can be inputted to the second manipulating unit 133.

Figure 3:
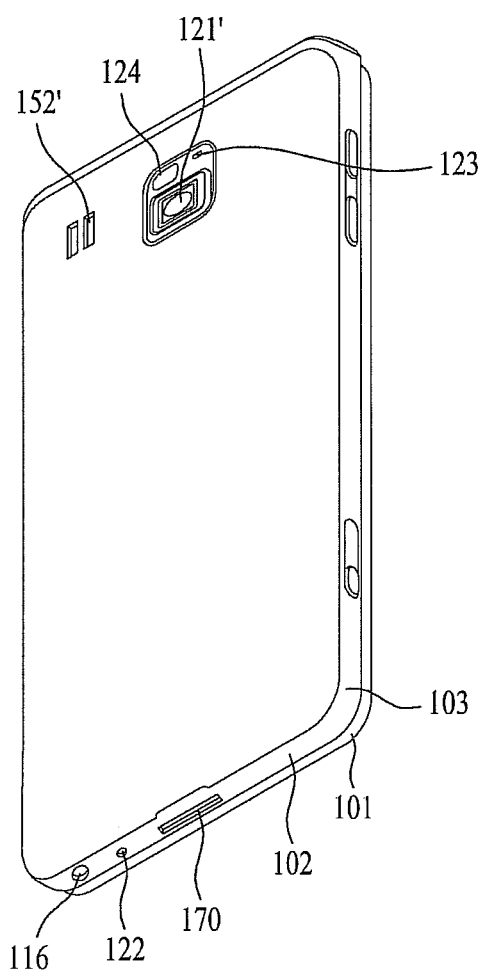
FIG. 3 is a rear perspective diagram of a mobile terminal according to one embodiment of the present invention.

FIG. 3 is a perspective diagram of a backside of the terminal shown in FIG. 2.

Referring to FIG. 3, a camera 121' can be additionally provided to a backside of the terminal body, and more particularly, to the rear case 102. The camera 121 has a photographing direction that is substantially opposite to that of the former camera 121 shown in FIG. 2 and may have pixels differing from those of the firmer camera 121.

Preferably, for instance, the former camera 121 has low pixels enough to capture and transmit a picture of user's face for a video call, while the latter camera 121' has high pixels for capturing a general subject for photography without transmitting the captured subject. And, each of the cameras 121 and 121' can be installed at the terminal body to be rotated or popped up.

A flash 123 and a mirror 124 are additionally provided adjacent to the camera 121'. The flash 123 projects light toward a subject in case of photographing the subject using the camera 121'. In case that a user attempts to take a picture of the user (self-photography) using the camera 121', the mirror 124 enables the user to view user's face reflected by the mirror 124.

An additional audio output unit 152' can be provided to the backside of the terminal body. The additional audio output unit 152' is able to implement a stereo function together with the former audio output unit 152 shown in FIG. 2 and may be used for implementation of a speakerphone mode in talking over the terminal.

A broadcast signal receiving antenna 116 can be additionally provided to the lateral side of the terminal body as well as an antenna for communication or the like. The antenna 116 constructing a portion of the broadcast receiving module 111 shown in FIG. 1 can be retractably provided to the terminal body.

In the following description, embodiments relating to a controlling method implemented in the above-configured mobile terminal shall be explained with reference to the accompanying drawings.

For clarity and convenience of the following description, assume that a mobile terminal mentioned in the following description includes at least one of the components shown in FIG. 1. In particular, assume that a mobile terminal according to the present invention includes the memory 160 configured to store data, the display unit 151 configured to output an image signal of a video, the audio output module 152 configured to output an audio signal of the video, and the controller 180 separating a voice signal of the video by sound sources, the controller 180 controlling a volume of at least one of the separated sound sources to be adjusted. In some cases, the mobile terminal according to the present invention may further include the camera 121 configured to record a video and the microphone 122 configured to record a voice.

If the display unit 151 of the mobile terminal according to the present invention includes a touchscreen in concept subordinate to the display unit 151, implementation of the following embodiments may be further facilitated. Therefore, the following description is made on the assumption that the display unit 151 includes the touchscreen. Yet, it may be unnecessary for the display unit 151 to include the touchscreen. If the display unit 151 does not include the touchscreen, the mobile terminal according to the present invention may further include a separate functional unit (e.g., the user input device 130 shown in FIG. 1) configured to receive a user input.

A video mentioned in the description of the present invention may conceptionally include a video call (or a conference call) configured to output both a voice signal and an audio signal simultaneously as well as a video file saved in the memory 160 and a broadcast content received from a broadcasting station server.

Based on the above-mentioned assumptions, a mobile terminal according to the present invention is described in detail with reference to an operational flowchart of the mobile terminal according to the present invention.

Figure 4:
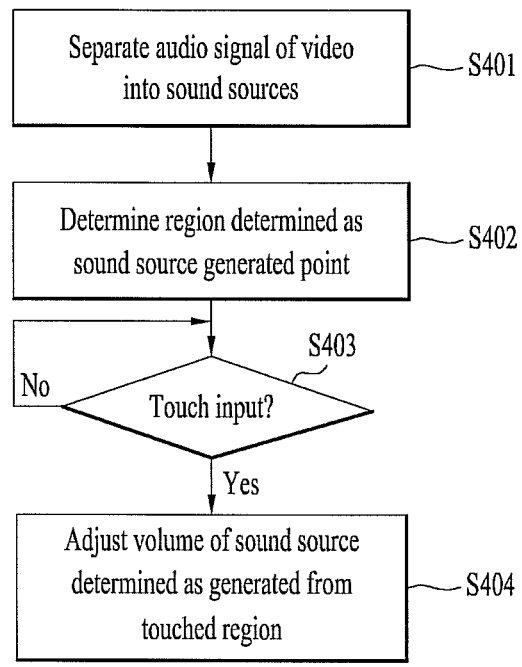
FIG. 4 is a flowchart for an operation of a mobile terminal according to the present invention.

FIG. 4 is a flowchart for an operation of a mobile terminal according to the present invention. Prior to the description of the operational flowchart shown in FIG. 4, assume that the controller 180 controls a video to be currently played. Hence, an image signal (or a video signal) of the video may be outputted through the touchscreen and an audio signal of the video may be outputted through the audio output module 152.

Referring to FIG. 4, while the mobile terminal is playing a video, the controller 180 analyzes an audio signal of the video and is then able to separate the audio signal of the video into individual sound sources [S401]. In particular, in case that the audio signal of the video is a mixture of several sound sources, the controller 180 can individually separate the audio signal into several sound sources through source separation.

Figure 5:
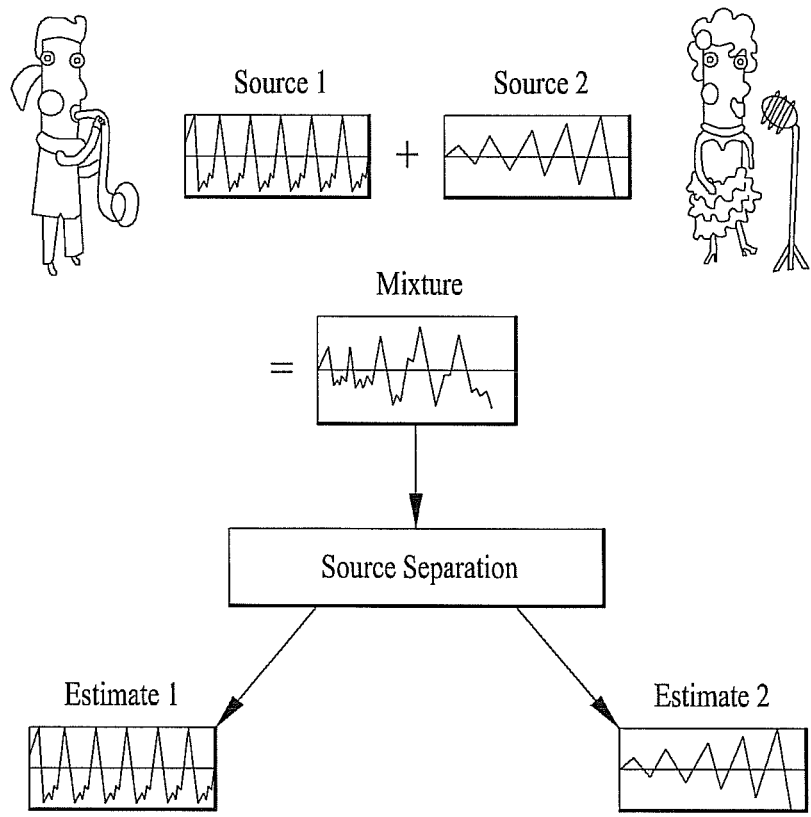
FIG. 5 is a diagram for one example to describe a process for applying source separation to an audio signal having several sound sources mixed therein.

FIG. 5 is a diagram for one example to describe a process for applying source separation to an audio signal having several sound sources mixed therein.

Referring to FIG. 5, if an audio signal (e.g., a mixture shown in FIG. 5) of a video includes a mixture of a sound source 1 (e.g., Source 1 shown in FIG. 5) and a sound source 2 (e.g., Source 2 shown in FIG. 5), the controller 180 can separate the audio having the sound source 1 and the sound source 2 mixed therein into a sound source 1 (e.g., Estimate 1 shown in FIG. 5) and a sound source 2 (e.g., Estimate 2 shown in FIG. 5).

According to the present invention, sound sources included in the audio signal may include various kinds of sound sources including a human voice, a sound of instrument, a sound generated from noise and the like. In case that voices of a plurality of characters or sounds of a plurality of instruments are included in the audio signal, the controller 180 can separate the sound sources by characters or instruments.

Referring now to FIG. 4, the controller 180 analyzes the output image of the touchscreen and is then able to determine a region determined as a sound source generated point [S402]. Thereafter, if a touch input is inputted to the region determined as the sound source generated point [S403], the controller 180 may control a volume of the sound source generated from the corresponding region to be adjusted manually or automatically [S404].

For instance, if at least one voice is extracted from the audio signal of the video, the controller 180 can attempt to match at least one character outputted to the touchscreen to the extracted at least one voice. Subsequently, if a specific character is selected from the at least one or more characters outputted to the touchscreen, the controller 180 can control a volume of a specific voice, which is determined as uttered by the specific character among the extracted at least one voice, to be adjusted manually or automatically. For another instance, if at least one instrument sound is extracted from the audio signal of the video, the controller 180 can attempt to match at least one instrument outputted to the touchscreen to the extracted at least one instrument sound. Subsequently, if a specific instrument is selected from the at least one or more instruments outputted to the touchscreen, the controller 180 can control a volume of a specific instrument sound, which is matched to the specific instrument among the extracted at least one instrument sound, to be adjusted manually or automatically.

If both a voice and an instrument sound are extracted from the audio signal, the controller 180 matches each sound source to a corresponding sound source generated point and is then able to control a volume of a prescribed one of the sound sources to be adjusted manually or automatically.

A process for adjusting a volume of an extracted sound source by matching a sound source generated point to the extracted sound source shall be described with reference to the accompanying drawings as follows.

Figure 6:
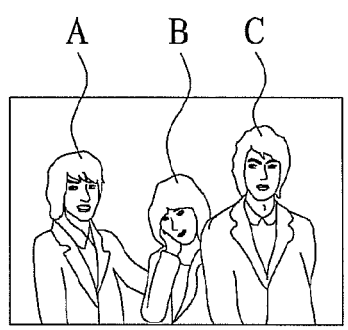
FIG. 6 is a diagram for one example to describe a process for matching a voice extracted from an audio signal of a video to at least one character displayed on a touchscreen.
Figure 6:
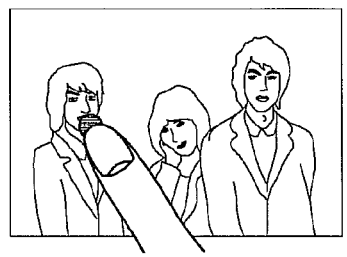
Figure 6:
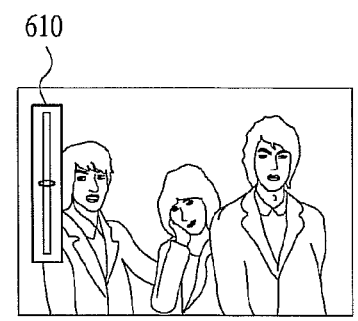
Figure 6:
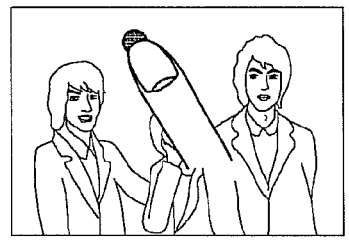
Figure 6:
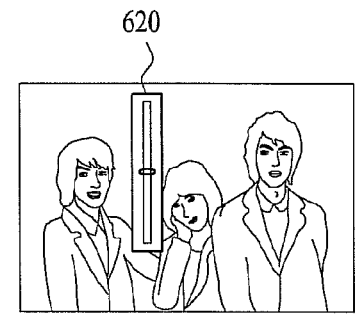

FIG. 6 is a diagram for one example to describe a process for matching a voice extracted from an audio signal of a video to at least one character displayed on a touchscreen. For clarity of the following description, assume that 3 different characters are outputted, as shown in FIG. 6 (a), to the touchscreen while a video is being played. Moreover, the 3 characters displayed on the touchscreen shall be named a character A, a character B and a character C in left-to-right direction, respectively.

Referring to FIG. 6, if at least one voice is extracted from an audio signal of a video, the controller 180 may attempt to match at least one character outputted to the touchscreen to the extracted at least one voice.

In particular, the controller 180 can determine whether the extracted voice is uttered by the character outputted to the touchscreen based on a presence or non-presence of movement of a mouth of the character outputted to the touchscreen in the course of outputting the respective voices by applying a face recognition algorithm. While the extracted voice is outputted, if the mouth of the specific character outputted to the touchscreen moves, the controller 180 can determine that the extracted voice is uttered by the specific character outputted to the touchscreen.

For instance, when a voice A extracted from an audio signal of a video is outputted, if a mouth of the character A is moving, the extracted voice A may be determined as uttered by the character A. Likewise, when a voice B and a voice C are outputted, if a mouth of the character B and a mouth of the character C are moving, the controller 180 can match the extracted voice B and the extracted voice C to the character B and the character C, respectively.

If the voice extracted from the audio signal is not determined as uttered by the character outputted to the touchscreen, the controller 180 can determine that the extracted voice is uttered by a $3^{rd}$ party not caught on the video. For instance, when a voice D extracted from the audio signal of the video is outputted, if the mouth of each of the characters A to C is not moving, the controller 180 can determine that the voice D is uttered by the $3^{rd}$ party not caught on the video.

If the at least one character outputted to the touchscreen and the extracted at least one voice are matched to each other, the controller 180 can control a volume of the extracted voice to be adjusted manually or automatically. In particular, if a specific character is selected from at least one or more characters outputted to the touchscreen, the controller 180 can control a volume of a specific voice matched to the selected specific character to be turned up or down automatically or may control a volume adjust bar to be displayed in order to manually adjust the volume of the specific voice matched to the selected specific character.

For instance, if a touch input is applied to the character A displayed on the touchscreen [FIG. 6 (b)], the controller 180 can control a volume adjust bar 610, which is provided to adjust a volume of the voice A determined as uttered by the character A, to be displayed [FIG. 6 (c)]. Based on a touch input to the volume adjust bar 610, the controller 180 can control the volume of the voice A to be turned up or down. If a touch input is applied to the character B, the controller 180 may adjust a volume of the voice B determined as uttered by the character B [not shown in the drawing]. If a touch input is applied to the character C, the controller 180 may adjust a volume of the voice C determined as uttered by the character C [not shown in the drawing].

If the voice outputted from the audio signal of the video is not matched to anyone of the characters outputted through the touchscreen, as mentioned in the foregoing description, the extracted voice can be determined as the $3^{rd}$ party not caught on the video.

In this case, the controller 180 may assign at least one portion of a remaining region except a region, on which at least one character outputted to the touchscreen is displayed, as a region for adjusting a volume of the voice determined as uttered by the $3^{rd}$ party. Thereafter, if the assigned region is selected, the controller 180 may control a volume of the voice, which is determined as uttered by the $3^{rd}$ party, to be automatically turned up or down or may control a volume adjust bar, which is provided to manually adjust a volume of the voice uttered by the $3^{rd}$ party, to be displayed.

For instance, if a touch input is applied to a region outside a display region of the characters A to C displayed on the touchscreen [FIG. 6 (d)], the controller 180 may control a volume adjust bar 620, which is provided to adjust a volume of the voice D determined as uttered not by the characters A to C displayed on the touchscreen but by the $3^{rd}$ party, to be displayed [FIG. 6 (e)]. Based on a touch input to the volume adjust bar 620, the controller 180 can turn up or down the volume of the voice D.

If a volume of a prescribed one of the extracted voices is turned up, the controller 180 may control volumes of other sound sources except the turned-up voice to be turned down. For instance, if the volume of the voice A determined as uttered by the character A is turned up, the controller 180 can control the volumes of the voices B and C, which are determined as uttered by the characters B and C, to be turned down. Moreover, the controller 180 may control a volume of a background sound, which is included in the audio signal, to be turned down as well. This is to control a specific voice to be further clearly outputted in a manner of increasing a difference between the volume of the specific voice and the volumes of other sound sources. In this case, the background sound may mean such a sound source except the extracted voices as a background music outputted together with the voices, a noise and the like.

On the contrary, if a volume of a prescribed one of the extracted voices is turned down, the controller 180 may control volumes of other sound sources except the turned-down voice to be turned up.

In case that a voice is extracted from an audio signal of a video, the controller 180 may control a text corresponding to the extracted voice to be displayed using STT (speech to text). Since various voices are mixed in the audio signal of the video, if it is difficult to listen to each of the voices individually, a user can recognize a content of the video with ease by viewing the text.

Figure 7:
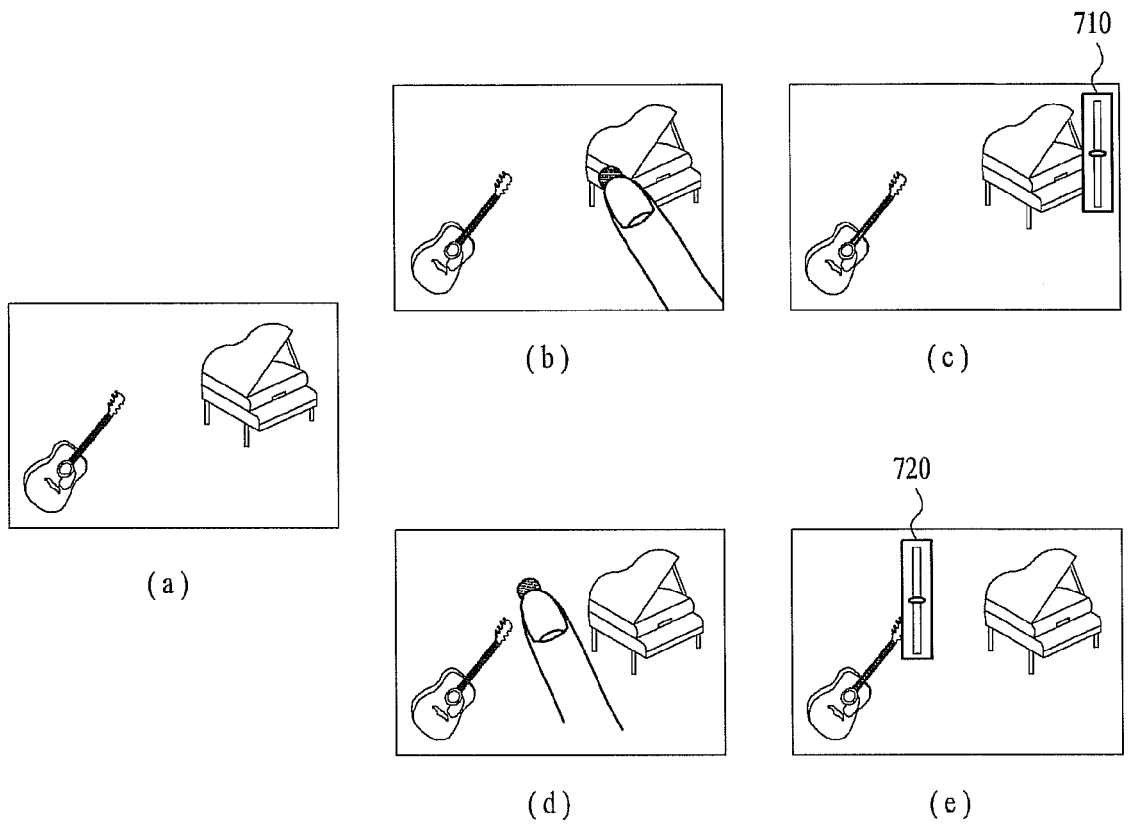
FIG. 7 is a diagram for one example to describe a process for matching an instrument sound extracted from an audio signal of a video to at least one instrument displayed on a touchscreen.

FIG. 7 is a diagram for one example to describe a process for matching an instrument sound extracted from an audio signal of a video to at least one instrument displayed on a touchscreen. For clarity of the following description, assume that a piano and a guitar are displayed on the touchscreen while a video is being played.

Referring to FIG. 7, if at least one instrument sound is extracted from an audio signal of a video, the controller 180 can attempt to match at least one instrument outputted to the touchscreen to the extracted at least one instrument sound. In particular, the controller 180 determines that the instrument sound extracted from the audio signal corresponds to which instrument by applying an algorithm for recognizing an instrument and is then able to control the at least one instrument outputted to the touchscreen to the at least one instrument sound to be matched to each other based on whether the determined instrument is displayed on the touchscreen.

For instance, if the instrument sound extracted from the audio signal of the video is a piano sound, the controller 180 may match a piano instrument sound to a display region of a piano. For another instance, if the instrument sound extracted from the audio signal of the video is a guitar sound, the controller 180 may match a guitar instrument sound to a display region of a guitar.

If the instrument matched to the instrument sound extracted from the audio signal of the video is determined as not displayed on the touchscreen, the controller 180 can determine that the extracted instrument sound is a sound of a $3^{rd}$ instrument not caught on the video. For instance, if the instrument sound extracted from the audio signal of the video is a xylophone sound, since the xylophone is not displayed on the touchscreen, the controller 180 can determine that the extracted xylophone sound is the sound of the $3^{rd}$ instrument not caught on the video.

If the at least one instrument outputted to the touchscreen and the extracted at least one instrument sound are matched to each other, the controller 180 can control a volume of the extracted instrument sound to be adjusted manually or automatically. In particular, if a specific instrument is selected from at least one or more instruments outputted to the touchscreen, the controller 180 can control a volume of a specific instrument sound, which is matched to the selected specific instrument, to be automatically turned up or down. Alternatively, the controller 180 may control a volume adjust bar, which is provided to manually adjust a volume of the specific instrument sound matched to the selected specific instrument, to be displayed.

For instance, if a touch input is applied to the piano displayed on the touchscreen [FIG. 7 (b)], the controller 180 can control a volume adjust bar 170, which is provided to adjust a volume of a piano sound, to be displayed [FIG. 7 (c)]. Based on the touch input to the volume adjust bar 710, the controller 180 can turn up or down the volume of the piano sound. If a touch input is applied to the guitar, the controller 180 may control a volume adjust bar, which is provided to adjust a volume of a guitar sound, to be displayed [not shown in the drawing].

If the instrument matched to the instrument sound extracted from the audio signal of the video is not displayed on the touchscreen, as mentioned in the foregoing description, the extracted instrument sound can be determined as a sound of a $3^{rd}$ instrument.

In this case, the controller 180 can assign at least one portion of a remaining region except a region for displaying the at least one instrument outputted to the touchscreen as a region for adjusting a volume of the $3^{rd}$ instrument sound. If a user selects the region assigned for adjusting the volume of the $3^{rd}$ instrument sound, the controller 180 can control the volume of the $3^{rd}$ instrument to be automatically turned up or down or may control a volume adjust bar, which is provided to manually adjust the volume of the $3^{rd}$ instrument, to be displayed.

For instance, when the $3^{rd}$ instrument sound is a xylophone sound, if a touch input is applied to a region outside a display region of the piano and guitar displayed on the touchscreen [FIG. 7 (d)], the controller 180 can control a volume adjust bar 720, which is provided to adjust the volume of the $3^{rd}$ instrument sound (i.e., the xylophone sound), to be displayed [FIG. 7 (e)]. Based on a touch input to the volume adjust bar 720, the controller 180 can turn up or down the volume of the $3^{rd}$ instrument sound (i.e., the xylophone sound).

If a volume of a prescribed one of the extracted instrument sounds is turned up or down, as mentioned in the foregoing description with reference to FIG. 6, volumes of other sound sources except the turned-up or -down instrument sound can be turned up or down.

In the examples shown in FIG. 6 and FIG. 7, a volume adjust bar for adjusting a volume of a specific sound source (e.g., a specific voice, a specific instrument sound, etc.) may be semi-transparently displayed on the touchscreen. This is to prevent the volume adjust bar from interrupting a playback of a video.

In the examples shown in FIG. 6 and FIG. 7, it is able to determine an individual sound source generated region by applying a face recognition algorithm or an instrument recognition algorithm to the touchscreen.

The mobile terminal according to one embodiment of the present invention can determine a face or instrument recognition algorithm applied region depending on whether an audio signal of a video is a mono type or a stereo type. In particular, in case that the audio signal of the video is the mono type, the controller 180 can determine an individual sound source generated region by applying a face recognition algorithm or an instrument recognition algorithm to a whole output image of the touchscreen. On the other hand, if the audio signal of the video is the stereo type, the controller 180 can control the face recognition algorithm or the instrument recognition algorithm to be preferentially applied to a region of the output image of the touchscreen, from which a specific sound source is estimated to be generated, only or an estimated region.

When a video sound is a stereo type, a process for restricting a region, to which a face recognition algorithm and an instrument recognition algorithm are applied, is described in detail with reference to FIG. 8 as follows.

Figure 8:
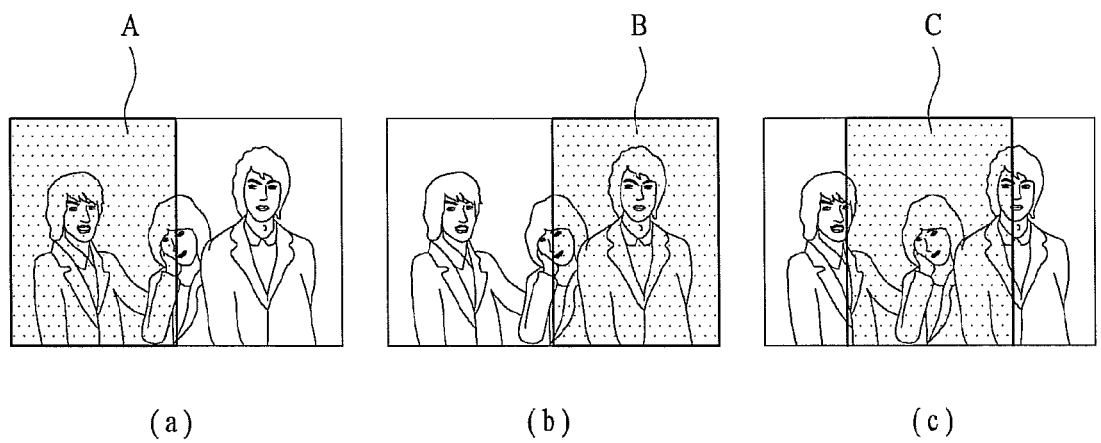
FIG. 8 is a diagram for one example to describe a face recognition algorithm applied region.

FIG. 8 is a diagram for one example to describe a face recognition algorithm applied region. For clarity of the following description, assume that an audio signal of a video is a stereo type of outputting a signal through two channels.

Referring to FIG. 8, the controller 180 can determine a region for applying a face recognition algorithm thereto based on an inclination of a voice extracted from an audio signal of a video. In this case, when the voice extracted from the audio signal is outputted, the inclination can be determined depending on whether the voice is outputted with a greater portion from which one of two channels. For instance, if a signal strength on a left channel of the voice extracted from the audio signal of the video is greater than that on a right channel thereof and each of the signal strengths on the left and right channels is equal to or greater than a threshold, the controller 180 can determine that the voice extracted from the audio signal is a left-inclining voice. On the contrary, if a signal strength on a right channel of the voice extracted from the audio signal of the video is greater than that on a left channel thereof and each of the signal strengths on the left and right channels is equal to or greater than the threshold, the controller 180 can determine that the voice extracted from the audio signal is a right-inclining voice. On the other hand, if each of the signal strengths on the left and right channels is smaller than the threshold, the controller 180 can determine that the voice extracted from the audio signal is a right-and-left balanced voice.

If the voice extracted from the audio signal is the left-inclining voice, referring to FIG. 8 (a), the controller 180 can control the face recognition algorithm to be applied to a left part A of the touchscreen only or to be preferentially applied to the left part A. Otherwise, if the voice extracted from the audio signal is the right-inclining voice, referring to FIG. 8 (b), the controller 180 can control the face recognition algorithm to be applied to a right part B of the touchscreen only or to be preferentially applied to the right part B. On the other hand, if the voice extracted from the audio signal is the right-and-left balanced voice, referring to FIG. 8 (c), the controller 180 can control the face recognition algorithm to be applied to a middle part C of the touchscreen only or to be preferentially applied to the middle part C.

In this case, if the face recognition algorithm is preferentially applied to a specific part of the touchscreen, it may mean the following. First of all, a search for a character matched to an extracted voice is performed by applying the face recognition algorithm to a selected region. Secondly, if the character matched to the extracted voice is not found from the selected region, a region for applying the face recognition algorithm thereto is extended to other regions.

Although the description with reference to FIG. 8 is limited to the face recognition algorithm only, the same description is applicable to the instrument recognition algorithm.

In the examples shown in FIGS. 8 (a) to 8 (c), a region for applying a face recognition algorithm or an instrument recognition algorithm is determined based on an inclination of a specific sound source. On the other hand, a mobile terminal according to another embodiment of the present invention can automatically determine a region, from which each sound source is estimated to be generated based on an inclination of a specific sound source, without applying a face recognition algorithm or an instrument recognition algorithm. To this end, the controller 180 partitions the touchscreen into partitioned regions as many as the number of sound sources separated from an audio signal of a video and is then able to match each of the partitioned regions to at least one sound source mutually. This is described in detail with reference to FIG. 9 as follows.

Figure 9:
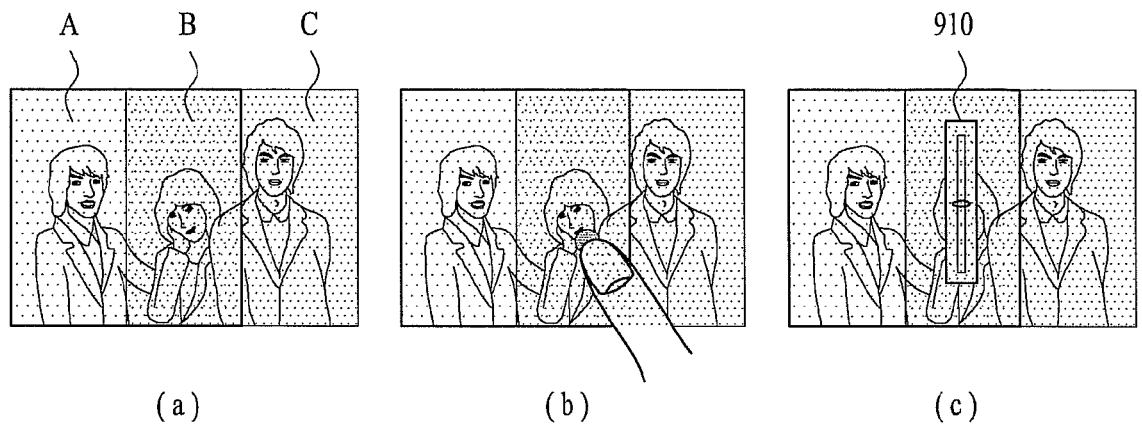
FIG. 9 is a diagram for one example to describe a process for partitioning a touchscreen into regions as many as the number of sound sources extracted from an audio signal.

FIG. 9 is a diagram for one example to describe a process for partitioning a touchscreen into regions as many as the number of sound sources extracted from an audio signal. For clarity of the following description, assume that three sound sources are extracted from an audio signal of a video.

Referring to FIG. 9, if three sound sources are extracted from an audio signal of a video, the controller 180 partitions the touchscreen into 3 regions A to C [FIG. 9 (a)] and is then able to control a sound source to be mapped to each of the partitioned regions. In doing so, the controller 180 can control each sound source and each region to be mapped to each other in consideration of an inclination of each sound source. In particular, in the example shown in FIG. 9, a sound source having a strongest left inclination among the 3 sound sources may be mapped to a far left region A of the touchscreen and a sound source having a strongest right inclination among the 3 sound sources may be mapped to a far right region C of the touchscreen. As the remaining sound source is mapped to a middle region B as a remaining region, it is able to determine a sound source generated point without applying a face recognition algorithm or an instrument recognition algorithm. Thereafter, if a touch input to a specific region is received [FIG. 9 (b)], the controller 180 may automatically turn up or down a volume of a sound source mapped to the specific region or may control a volume adjust bar 910, which is provided to manually adjust the volume of the sound source mapped to the specific region, to be displayed [FIG. 9 (c)].

In the examples shown in FIGS. 6 to 9, if a region, from which a sound source is determined as generated, is touched, a volume adjust bar for manually adjusting a volume of the sound source generated from the corresponding region is displayed. Yet, even if the volume of the sound source is manually adjusted, it is not mandatory for the volume adjust bar to be displayed on the touchscreen. A mobile terminal according to one embodiment of the present invention discriminates a case of inputting a $1^{st}$ touch to a sound source generated region from a case of inputting a $2^{nd}$ touch to the sound source generated region. If the $1^{st}$ touch is inputted, the mobile terminal can control a volume of a sound source generated from the corresponding region to be turned up. If the $2^{nd}$ touch is inputted, the mobile terminal can control a volume of a sound source generated from the corresponding region to be turned down. In this case, the $1^{st}$ touch may include an action of tapping the sound source generated region n times and the $2^{nd}$ touch may include an action of tapping the sound source generated region m times. Alternatively, the $1^{st}$ touch may include a flicking input in a $1^{st}$ direction and the $2^{nd}$ touch may include a flicking input in a $2^{nd}$ direction. Alternatively, the $1^{st}$ touch may include a drag input in a $1^{st}$ direction and the $2^{nd}$ touch may include a drag input in a $2^{nd}$ direction. The $1^{st}$ and $2^{nd}$ touch inputs are described in detail with reference to FIG. 10 as follows.

Figure 10:
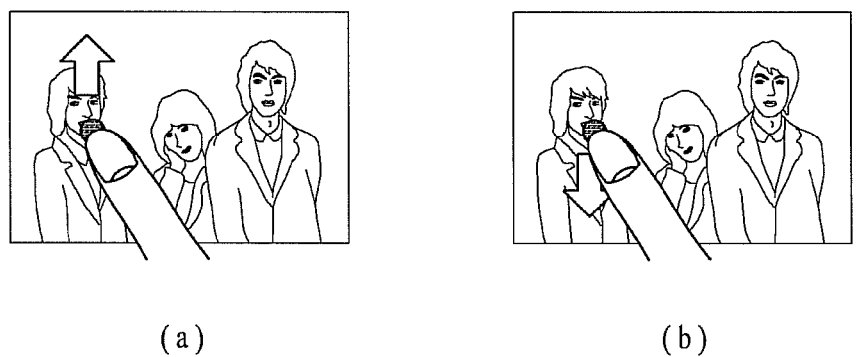
FIG. 10 is a diagram for one example to describe a process for adjusting a volume of a specific sound source by a $1^{st}$ touch input or a $2^{nd}$ touch input.

FIG. 10 is a diagram for one example to describe a process for adjusting a volume of a specific sound source by a $1^{st}$ touch input or a $2^{nd}$ touch input.

Referring to FIG. 10 (a), after a specific character displayed region has been touched, if a flicking input in a top direction is received, the controller 180 can control a volume of a specific voice matched to a specific character to be turned up. On the contrary, referring to FIG. 10 (b), after a specific character displayed region has been touched, if a flicking input in a bottom direction is received, the controller 180 can control a volume of a specific voice matched to a specific character to be turned down.

In case of intending to adjust a volume of a specific sound source using a flicking input or a drag input, the controller 180 can control a turned-up or -down level of the volume to be determined in consideration of at least one of a moving distance of a pointer and a moving sped of the pointer in order to apply the flicking input or the drag input. This is described in detail with reference to FIG. 11 as follows.

Figure 11:
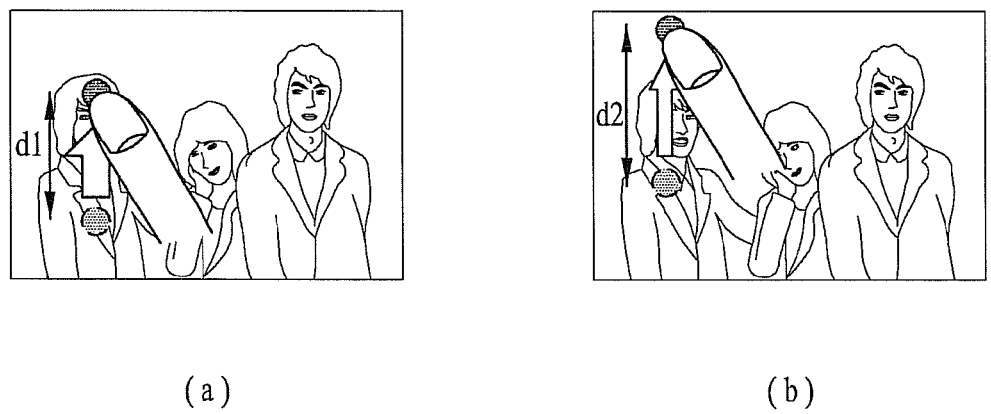
FIG. 11 is a diagram for one example to describe a process for adjusting an adjusted level of a volume in response to a moving distance of a pointer.

FIG. 11 is a diagram for one example to describe a process for adjusting an adjusted level of a volume in response to a moving distance of a pointer. For clarity of the following description, assume that a user's touch input for turning up a volume of a specific sound source includes a drag input in a top direction.

In FIG. 11 (a) and FIG. 11 (b), in order to turn up a volume of a specific sound source matched to a specific region, it is assumed that a drag input in a top direction is applied within a specific region. In doing so, the controller 180 may determine a volume-up level of the specific sound source based on a moving distance of a pointer in case of a drag input. For instance, referring to FIG. 11 (a), when a pointer has moved by a distance d1 for a drag input, if a volume of a specific sound source is turned up by a level x. On the other hand, when the pointer has moved by a distance d2 longer than the distance d1, the volume of the specific sound source can be turned up by a level y higher than the level x.

In particular, referring to FIG. 11, when a touch input for turning up or down a volume of a specific sound source is received, the controller 180 can determine an adjusted level of the volume based on a moving distance or speed of a pointer for applying the touch input.

According to the above-described embodiment, a sound source generated region is matched to each sound source separated from an audio signal of a video and a volume of each of the sound sources can be individually adjusted. The mobile terminal according to one embodiment of the present invention sorts sound sources separated from an audio signal of a video by categories and is then able to control a volume to be adjusted for each group. For instance, if a plurality of voices and a plurality of instrument sounds are extracted from an audio signal of a video, the controller 180 binds a plurality of the voices into one group and also binds a plurality of the instrument sounds into another group, thereby adjusting a volume per group automatically or manually. This is described in detail with reference to FIG. 12 as follows.

Figure 12:
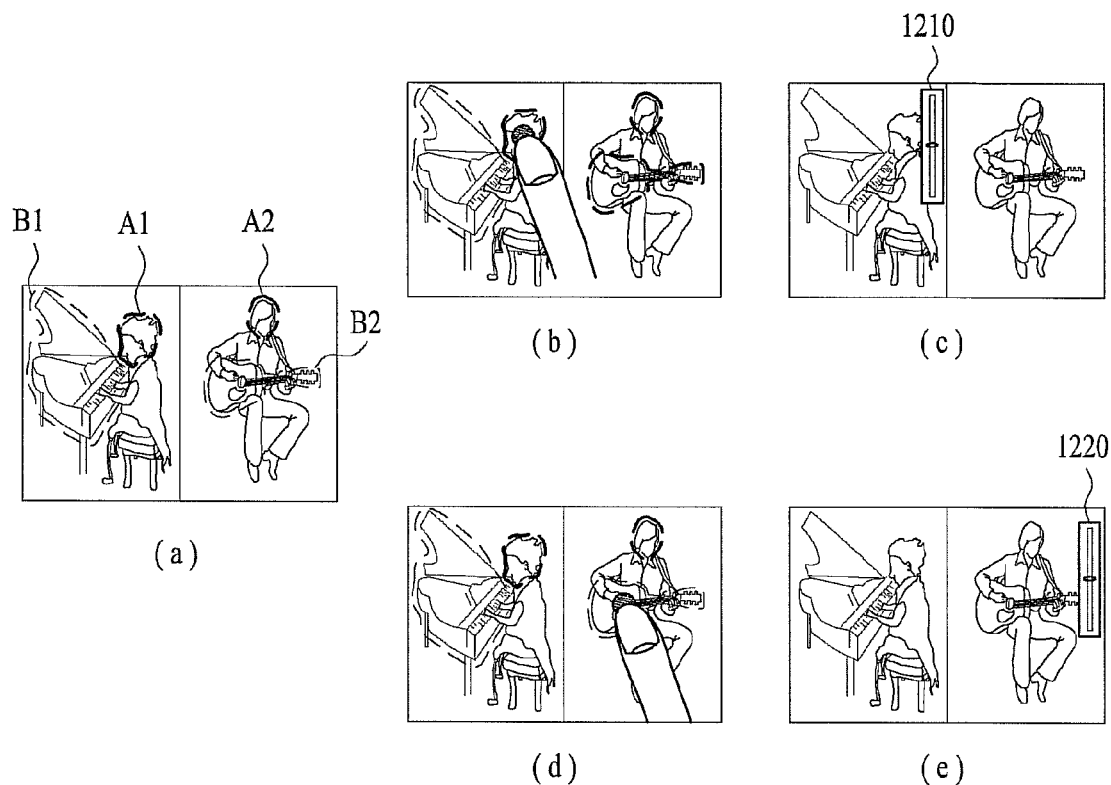
FIG. 12 is a diagram for one example to describe a process for sorting a plurality of sound sources by groups.

FIG. 12 is a diagram for one example to describe a process for sorting a plurality of sound sources by groups. For clarity of the following description, assume that two characters and two instruments are displayed on the touchscreen.

Referring to FIG. 12, if at least one voice and at least one instrument sound are extracted from an audio signal of a video, the controller 180 can group the sound sources into types. Hence, the at least one voice can be sorted into one group and the at least one instrument sound can be sorted into another group.

Subsequently, the controller 180 can assign a region corresponding to each of the groups to the touchscreen. For instance, referring to FIG. 12 (*a*), the controller 180 can control regions A1 and A2, on which characters are displayed, respectively, to be matched to a voice group. And, the controller 180 can control regions B1 and B2, on which instruments are displayed, respectively, to be matched to an instrument sound group.

Thereafter, if the region matched to the voice group is touched [FIG. 12 (*b*)], the controller 180 can control a volume adjust bar 1210, which is provided to adjust a volume of the voice group, to be displayed [FIG. 12 (*c*)]. In the example shown in FIG. 12 (*c*), if the volume of the voice group is turned up or down through a manipulation of the volume adjust bar 1210, the controller 180 can control a volume of the at least one voice, which belong to the voice group, to be turned up or down all.

For another instance, if the region matched to the instrument sound group is touched [FIG. 12 (*d*)], the controller 180 can control a volume adjust bar 1220, which is provided to adjust a volume of the instrument sound group, to be displayed [FIG. 12 (*e*)]. In the example shown in FIG. 12 (*e*), if the volume of the instrument sound group is turned up or down through a manipulation of the volume adjust bar 1220, the controller 180 can control a volume of the at least one instrument sound, which belong to the voice group, to be turned up or down all.

In the example shown in FIG. 12, the character displayed regions A1 and A2 are matched to the voice group and the instrument displayed regions B1 and B2 are matched to the instrument sound group, for clarity, by which the present invention may be non-limited. For instance, a region matched to each group may be determined by other rules.

In the example shown in FIG. 4, only if a touch input to a specific sound source generated point is received, it is able to adjust a volume of the specific sound source. Unlike the example shown in FIG. 4, the controller 180 can control at least one volume adjust bar, which is provided to adjust at least one sound source extracted on the basis of a user's touch input, to be simultaneously displayed. This is described in detail with reference to FIG. 13 as follows.

Figure 13:
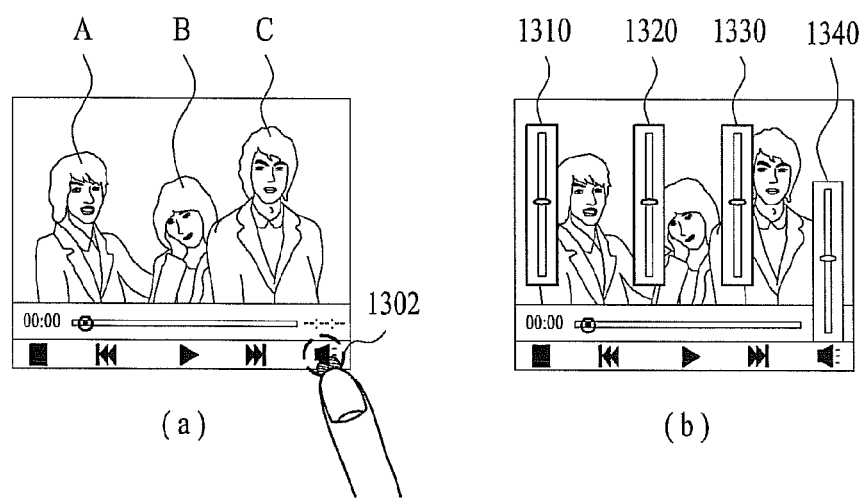
FIG. 13 is a diagram for one example to describe a process for simultaneously displaying at least one or more volume adjust bars.

FIG. 13 is a diagram for one example to describe a process for simultaneously displaying at least one or more volume adjust bars. For clarity of the following description, assume that three different characters A to C are displayed while a video is being played. And, assume that voices of the three characters are extracted from an audio signal of the video.

Referring to FIG. 13, if a user touches a volume adjust button 1302 to adjust a volume of a video [FIG. 13 (*a*)], the controller 180 can control at least one or more volume adjust bars 1310, 1320 and 1330, which are provided to adjust volumes of extracted sound sources, respectively, to be displayed [FIG. 13 (*b*)]. For instance, the volume adjust bar 1310 located nearby the character A is provided to adjust a volume of a sound source determined as a voice of the character A, the volume adjust bar 1320 located nearby the character B is provided to adjust a volume of a sound source determined as a voice of the character B, and the volume adjust bar 1330 located nearby the character C is provided to adjust a volume of a sound source determined as a voice of the character C. The controller 180 can control the volumes of the sound sources to be adjusted based on user inputs to the volume adjust bars 1310, 1320 and 1330, respectively.

The controller 180 may further display a main volume adjust bar 1340 for adjusting volumes of all sound sources together with the volume adjust bars 1310, 1320 and 1330 for adjusting the volumes of the corresponding sound sources, respectively. In the example shown in FIG. 13 (*b*), the controller 180 can turn up or down the volumes of the sound sources all based on a user input to the main volume adjust bar 1340.

In the example shown in FIG. 4, if a touch input is applied to a region determined as a sound source generated point, a volume of a specific sound source can be adjusted automatically or manually. Yet, in the example shown in FIG. 4, since the step S402 of determining the region determined as the sound source generated point and the step S403 of receiving the touch input may be unnecessary, the corresponding steps S402 and S403 can be skipped if necessary.

For instance, the controller 180 extracts a sound source of a prescribed type only from at least one or more sound sources extracted from an audio signal of a video and is then able to control a volume of the extracted sound source of the prescribed type to be automatically turned up or down. In particular, for example, if a voice and an instrument sound are extracted from an audio signal of a video, the controller 180 can control a volume of the voice to be automatically turned up.

For another example, the controller can automatically turn up a volume of a sound source belonging to a low-volume group among at least one or more sound sources extracted from an audio signal of a video or turn down a volume of a sound source belonging to a high-volume group among the at least one or more sound sources extracted from the audio signal of the video. In particular, for instance, when voices A to C are extracted from an audio signal of a video, if a size of the voice C is smaller than that of the voice A or B, the controller 180 turns up a volume of the voice C, thereby enabling a user to clearly listen to the voice C.

The mobile terminal according to the present invention may be used to adjust a volume of a sound source determined as the same character or instrument that matches a reference sound source. This is described in detail with reference to FIG. 14 as follows.

Figure 14:
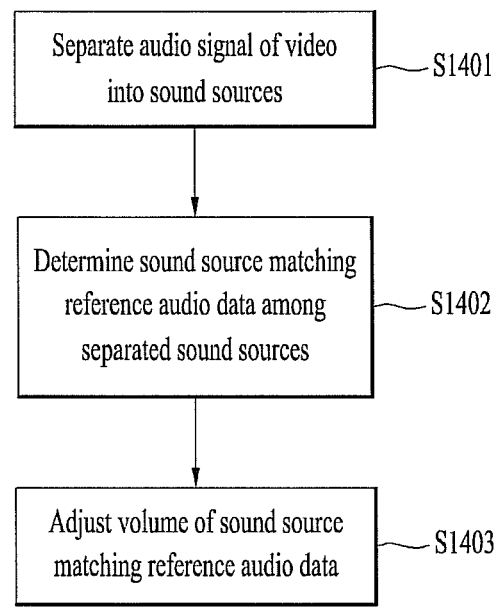
FIG. 14 is a flowchart for an operation of a mobile terminal according to the present invention.

FIG. 14 is a flowchart for an operation of a mobile terminal according to the present invention. Prior to describing the operational flowchart shown in FIG. 14, assume that the controller 180 is playing a video and that a reference audio data is saved in the memory 160.

Referring to FIG. 14, since a step S1401 corresponds to the former step S401 shown in FIG. 4, details of the step S1401 shall be omitted from the following description.

If an audio signal of a video is separated by sound sources, the controller 180 can determine a sound source matching a reference audio data among at least one or more separated sound sources [S1402]. In this case, the reference audio data is to perform a voice tracking. And, the sound source matching the reference audio data may mean a sound source determined as belonging to the same character of the reference audio data, a sound source determined as belonging to the same instrument of the reference audio data, or the like. For instance, in case that the reference audio data includes a voice of a specific character, the controller 180 can attempt to search at least one or more sound sources for a sound source determined as the voice of the specific character using speaker recognition. For another instance, in case that the reference audio data includes a piano sound, the controller 180 can attempt to search at least one or more sound sources for the piano sound.

If the sound source matching the reference audio data is found, the controller 180 can automatically or manually adjust a volume of the sound matching the reference audio data [S1403]. For instance, the controller 180 can control a volume adjust bar, which is provided to manually adjust a volume of the sound source matching the reference audio data, to be displayed on the touchscreen. The controller 180 can adjust a volume of a specific sound source based on a user input to the volume adjust bar. For another instance, the controller 180 can automatically turn up or down the volume of the sound source matching the reference audio data.

In case that the sound source matching the reference audio data is a voice of a specific character, the controller can control a text, which corresponds to a voice matching the reference audio data, to be displayed on the touchscreen using STT (speech to text). This is to enable a user to recognize a content of the voice matching the reference audio data conveniently and easily.

If the sound source matching the reference audio data is found, the controller 180 analyzes an output image of the touchscreen, determines a region determined as a point from which the sound source matching the reference audio data is found, and is then able to control the region determined as the sound source generated point to be visually identified. In particular, for example, the controller 180 controls the region determined as the sound source generated point to be displayed by being enlarged. For another example, the controller 180 controls the region determined as the sound source generated point to be visually identifiable from other regions in a manner of giving a graphic effect to the region determined as the sound source generated point. This is described in detail with reference to FIG. 15 as follows.

Figure 15:
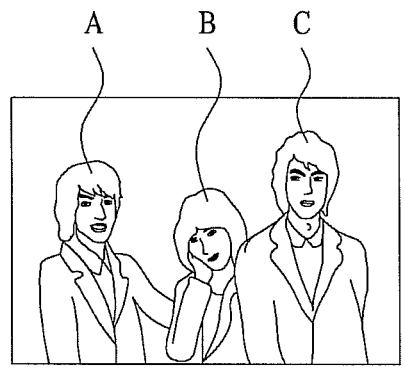
FIG. 15 is a diagram for one example to describe a process for visually identifying a region determined as a generated point of a sound source matching a reference audio data.
Figure 15:
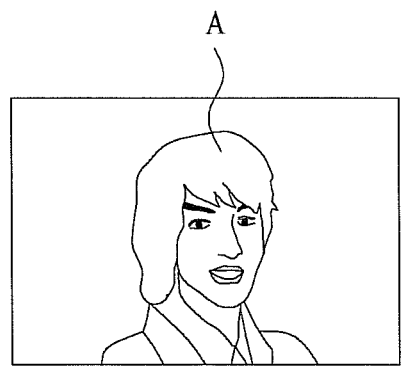

FIG. 15 is a diagram for one example to describe a process for visually identifying a region determined as a generated point of a sound source matching a reference audio data. For clarity of the following description, assume that three different characters are displayed on the touchscreen. And, the three characters displayed on the touchscreen shall be named characters A to C in left-to-right direction, respectively. Moreover, assume that a voice of the character A is set as a reference audio data.

Referring to FIG. 15, if at least one sound source is extracted from an audio signal of a video, the controller 180 can attempt a search for a sound source that matches a reference audio data. For instance, if voices A to C are extracted from the audio signal of the video, the controller 180 can determine a voice determined as a voice of the character A from the voices A to C. If the voice determined as the voice of the character A is determined as the voice A, the controller 180 can determine a region determined as a point from which the voice A is generated.

For instance, as mentioned in the foregoing description with reference to FIG. 6 (*a*), the controller 180 is able to determine the region determined as the voice-A generated point based on whether a mouth of a character outputted touchscreen is moving on outputting the voice A.

For another instance, if a reference image data corresponding to a reference audio data is saved in the controller 180, the controller 180 can determine a region determined as the same character or instrument of the reference image data as the voice-A generated point. For example, if the reference image data includes a photo of the character A, the controller 180 can determine a displayed region of the character determined as the same character of the reference image data as the voice-A generated point.

Once the voice-A generated point is determined, the controller 180 can control the voice-A generated point to be displayed in a manner of being visually identifiable from other regions. For instance, referring to FIG. 15 (*b*), the controller can control the region determined as the voice-A generated point to be displayed in a manner of being enlarged. Thus, a user can confirm that the sound source matching the reference audio data is displayed on which region.

In the examples shown in FIG. 4 and FIG. 14, while a video is being played through the touchscreen, a volume of a specific sound source can be adjusted. The mobile terminal according to the present invention can control a volume of a specific sound source to be adjusted on shooting a video as well as on playing a video.

For instance, if a specific region is selected while a video is recorded, the controller 180 can control a volume of a specific sound source, which is determined as generated from the selected region, to be turned up or down. In particular, the controller 180 separates an audio source outputted through the microphone 122 by sound sources through source separation, determines a specific sound source determined as generated from the user-selected region, and is then able to turn up or down a volume of the specific sound source. In this case, if the specific sound source includes a voice of a specific character, the controller 180 can control a text corresponding to the voice to be displayed on the touchscreen by applying STT.

For another instance, in case that a reference audio data is saved in the memory 160, the controller 180 can control a volume of a specific sound source, which matches the reference audio data, to be turned up or down. In particular, the controller 180 separates an audio source outputted through the microphone 122 by sound sources through source separation, determines a specific sound source determined as the same character's voice of the reference audio data or the same instrument sound of the reference audio data, and is then able to turn up or down a volume of the specific sound source. In this case, if the specific sound source includes a voice of a specific character, the controller 180 can control a text corresponding to the voice to be displayed on the touchscreen by applying STT.

The mobile terminal according to the present invention can control a volume of a specific sound source to be adjusted in case of playing a music as well as playing a video.

For instance, the controller 180 discriminates an instrument sound and a voice from each other in the course of playing a music and is then able to control a volume of at least one of the voice and the instrument sound to be adjusted.

Figure 16:
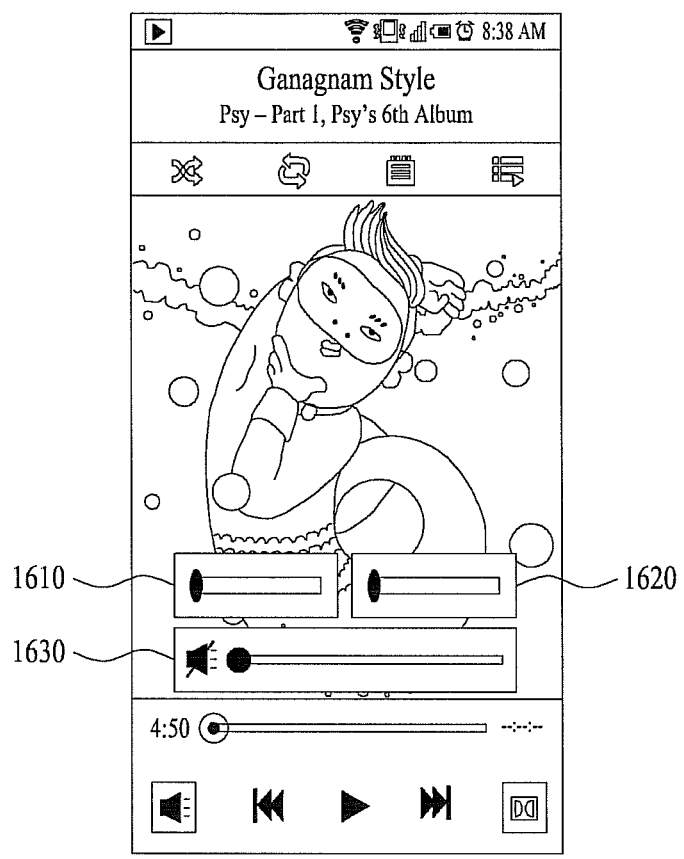
FIG. 16 is a diagram for one example of a screen provided to adjust a volume of a specific sound source in the course of playing a music.

FIG. 16 is a diagram for one example of a screen provided to adjust a volume of a specific sound source in the course of playing a music. For clarity of the following description, assume that an audio signal of a music is separated into a voice and an instrument sound.

Referring to FIG. 16, the controller 180 can control a volume adjust bar, which is provided to adjust a volume of each sound source, to be displayed. Moreover, the controller 180 can control a volume adjust bar, which is provided to turn up or down volumes of all sound sources commonly, to be further displayed.

In the example shown in FIG. 16, a main volume adjust bar 1630 is provided to turn up or down volumes of all sound sources in common, a $1^{st}$ sub-volume adjust bar 1610 may be provided to turn up or down a volume of the voice, and a $2^{nd}$ sub-volume adjust bar 1620 may be provided to turn up or down a volume of the instrument sound.

According to the embodiments mentioned in the foregoing description, the display unit 151 of the mobile terminal is assumed as including the touchscreen. If the display unit 151 of the mobile terminal fails to include the touchscreen, the touch inputs in the above-described embodiments may be substituted with other user inputs that can be obviously devised by those skilled in the art to which the present invention pertains.

Accordingly, embodiments of the present invention provide various effects and/or features.

First of all, the present invention can provide a mobile terminal, by which user's convenience can be enhanced.

In particular, the present invention can provide a mobile terminal and controlling method thereof, by which a volume of at least one of separated sound sources generated from separating an audio signal of a video by sound sources can be adjusted.

Moreover, the present invention can provide a mobile terminal and controlling method thereof, by which a volume of a desired sound source can be automatically adjusted if the desired sound source is found from an audio signal of a video.

It will be appreciated by those skilled in the art that the present invention can be specified into other form(s) without departing from the spirit or scope of the inventions.

In addition, the above-described methods can be implemented in a program recorded medium as computer-readable codes. The computer-readable media may include all kinds of recording devices in which data readable by a computer system are stored. The computer-readable media may include ROM, RAM, CD-ROM, magnetic tapes, floppy discs, optical data storage devices, and the like for example and also include carrier-wave type implementations (e.g., transmission via Internet).

It will be appreciated by those skilled in the art that various modifications and variations can be made in the present invention without departing from the spirit or scope of the inventions. Thus, it is intended that the present invention covers the modifications and variations of this invention provided they come within the scope of the appended claims and their equivalents.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A mobile terminal comprising:
a display configured to display an image of a video;
an audio output unit configured to output an audio of the video; and
a controller configured to separate the audio of the video into a plurality of sound sources, to determine at least one object of the image corresponding to at least one of the plurality of sound sources by analyzing the displayed image, to match each of the at least one object to a separate corresponding one of the plurality of sound sources based on movement of the corresponding at least one object, and based on an input to the display corresponding to the at least one object, to control a volume of the corresponding one of the sound sources that matches the at least one object corresponding to the input.

2. The mobile terminal of claim 1, wherein the controller is configured to automatically control the volume of the at least one of the sound sources.

3. The mobile terminal of claim 1, wherein the controller is configured to control the volume of the at least one of the sound sources based on a user's manual operation.

4. The mobile terminal of claim 1, wherein when at least one voice is extracted from the audio of the video, the controller is configured to map at least one character displayed by the display to the extracted at least one voice.

5. The mobile terminal of claim 4, wherein the controller is configured to map the at least one character to the extracted at least one voice based on movement of the at least one character.

6. The mobile terminal of claim 4, wherein in response to selection of a specific character from the at least one character displayed by the display, the controller is configured to adjust a volume of a specific voice determined to correspond to the specific character mapped to the extracted at least one voice.

7. The mobile terminal of claim 6, wherein when the volume of the specific voice is one of increased or decreased, the controller is configured to control volumes of other ones of the sound sources in the other one of increased or decreased.

8. The mobile terminal of claim 6, wherein in response to a first touch input at the displayed specific character, the controller is configured to control the volume of the specific voice to be increased, and wherein in response to a second touch input at the displayed specific character, the controller is configured to control the volume of the specific voice to be decreased.

9. The mobile terminal of claim 4, wherein in response to selection of a specific character from the displayed at least one character, the controller is configured to display a text corresponding to an extracted voice of the specific character.

10. The mobile terminal of claim 1, further comprising a memory configured to store reference audio data, wherein the controller is configured to determine a specific sound source that matches audio data from among the plurality of sound sources, and to then control a volume of the specific sound source to be increased or decreased.

11. The mobile terminal of claim 10, wherein the controller is configured to determine a sound source, which is determined as a voice of a same character of the audio from among the plurality of sound sources, as the specific sound source.

12. The mobile terminal of claim 10, wherein the controller is configured to determine a sound source, which is determined as a same instrument of the audio from among the plurality of sound sources, as the specific sound source.

13. The mobile terminal of claim 10, wherein the controller is configured to control a specific region corresponding to the input to be displayed so as to be visually identifiable when displaying the image of the video.

14. The mobile terminal of claim 13, wherein the controller is configured to control the specific region to be displayed in an enlarged manner.

15. The mobile terminal of claim 1, wherein the controller is configured to display a sub-volume adjust bar to adjust a volume of at least one of the plurality of sound sources.

16. The mobile terminal of claim 1, wherein the controller is configured to display a main volume adjust bar to adjust volumes of all of the plurality of sound sources.

17. The mobile terminal of claim 1, wherein when the audio corresponds to a stereo audio, the controller is configured to partition the display into at least one region corresponding to a number of at least one sound source extracted from the audio and map the extracted at least one sound source to the partitioned at least one region using an inclination of the extracted at least one sound source.

18. A method of controlling a mobile terminal, comprising:
displaying a video on a display of the mobile terminal;
separating audio of the video into a plurality of sound sources;
determining at least one object of the video corresponding to at least one of the plurality of sound sources by analyzing the displayed video;
matching each of the at least one object to a separate corresponding one of the plurality of sound sources based on movement of the corresponding at least one object; and
based on an input to the display corresponding to the at least one object, controlling a volume of the corresponding one of the sound sources that matches the at least one object corresponding to the input.

19. The method of claim 18, wherein controlling the volume includes automatically controlling the volume of the at least one of the sound sources.

20. The method of claim 18, wherein controlling the volume includes controlling the volume of the at least one of the sound sources based on a user's manual operation.

21. The method of claim 18, further comprising:
extracting at least one voice from the audio of the video, and
mapping at least one displayed character to the extracted at least one voice.

22. The method of claim 21, wherein the extracted at least one voice is mapped based on movement of the at least one character.

23. The method of claim 19, further comprising:
receiving a selection of a specific character from the displayed at least one character, and
adjusting a volume of a specific voice determined to correspond to the specific character from among the extracted at least one voice.

24. The method of claim 18, further comprising displaying a volume adjust bar to adjust a volume of at least one of the separated sound sources.

25. A mobile terminal comprising:
a display to display an image of a video;
an audio output device to output audio corresponding to the video; and
a controller to separate the audio into a plurality of sources, to determine at least one object of the image corresponding to at least one of the plurality of sources by analyzing the displayed image, to match each of the at least one object to a separate corresponding one of the plurality of sources based on movement of the corresponding at least one object, and based on a user's input to the display corresponding to the at least one object, to control volume of the corresponding one of the at least one of the sources that matches the at least one object corresponding to the user's input.

26. The mobile terminal of claim 25, wherein when at least one voice is extracted from the audio corresponding to the video, the controller is configured to map at least one displayed character to the extracted at least one voice.

27. The mobile terminal of claim 26, wherein the controller is configured to map the at least one character to the extracted at least one voice based on movement of a mouth of the displayed at least one character.

28. The mobile terminal of claim 26, wherein in response to selection of a specific character from a plurality of displayed characters, the controller is configured to adjust a volume of a specific voice that corresponds to the specific character, wherein the specific voice is extracted from the audio corresponding to the video.

29. The mobile terminal of claim 25, wherein the controller is configured to display a volume adjust bar to adjust a volume of at least one of the plurality of sources.

* * * * *